United States Patent [19]

Mihira et al.

[11] Patent Number: 5,160,542
[45] Date of Patent: Nov. 3, 1992

[54] APPARATUS FOR VAPORIZING AND SUPPLYING ORGANOMETAL COMPOUNDS

[75] Inventors: Hiroshi Mihira; Tetsuo Shimizu, both of Kyoto; Kazuhiro Hirahara; Toshinobu Ishihara, both of Nigata; Seiki Takaya, Kanagawa, all of Japan

[73] Assignees: Stec Inc., Kyoto; Shin-Etsu Chemical Co., Ltd., Tokyo, both of Japan

[21] Appl. No.: 580,587

[22] Filed: Sep. 11, 1990

[30] Foreign Application Priority Data

Sep. 12, 1989 [JP] Japan .................................. 1-234766
Sep. 12, 1989 [JP] Japan .................................. 1-234767

[51] Int. Cl.$^5$ .............................................. C23C 16/00
[52] U.S. Cl. ..................................... 118/715; 118/724; 118/726; 156/611; 427/248.1; 427/255.2
[58] Field of Search ............... 118/715, 719, 724, 726; 156/611, 613, 614, 610; 427/248.1, 255.2

[56] References Cited

U.S. PATENT DOCUMENTS

| | | | |
|---|---|---|---|
| 4,051,382 | 8/1977 | Ogawa et al. | 118/723 |
| 4,066,481 | 1/1978 | Manasevit et al. | 156/610 |
| 4,844,006 | 7/1989 | Page, Jr. et al. | 118/719 |
| 4,904,337 | 2/1990 | Elliott et al. | 156/610 |
| 4,950,621 | 8/1990 | Irvine et al. | 156/613 |

FOREIGN PATENT DOCUMENTS 0200215 4/1986 European Pat. Off. .
8701614 3/1987 PCT Int'l Appl. .
787076 12/1957 United Kingdom .

Primary Examiner—Shrive Beck
Assistant Examiner—Terry J. Owens
Attorney, Agent, or Firm—McAulay Fisher Nissen Goldberg & Kiel

[57] ABSTRACT

An apparatus for vaporizing and supplying an organometal compound comprising a gas flow path for starting gas which connects a container filled with the organometal compound to a crystal growth chamber heated under reduced pressure through a main valve, a massflow controller for the starting gas and a valve for supplying the starting gas; and a flow path for a carrier gas which connects a carrier gas source to the discharge outlet of the valve for supplying the starting gas through a massflow controller for carrier gas and a heat exchanger. The container, the flow path for the starting gas and the flow path for the carrier gas are arranged in a constant temperature oven.

9 Claims, 8 Drawing Sheets

APPARATUS FOR VAPORIZING AND SUPPLYING ORGANOMETAL COMPOUNDS

BACKGROUND OF THE INVENTION

The present invention relates to an apparatus for vaporizing and supplying an organometal compound used as a starting material for manufacturing an epitaxial thin film of a compound semiconductor according to the metal organic chemical vapor deposition (MOCVD) technique.

The MOCVD technique in which an organometal compound is employed as a starting material has become of major interest recently as a means for growing crystals of a compound semiconductor. According to the MOCVD technique, a crystalline thin film is formed or grows through the thermal decomposition of an organometal compound such as $(CH_3)_3Ga$ or $(CH_3)_3Al$ as a starting material followed by the deposition of the resulting vapor of the decomposed organometal compound onto the surface of a substrate. In particular, this technique makes it possible to form a thin film having a uniform thickness on a substrate having a large surface area and is excellent in mass-productivity and controllability of the film composition and thickness or the like.

When an organometal compound is used in the MOCVD technique, a carrier gas such as hydrogen gas is bubbled through the organometal compound contained in a container so that it comes in contact with the compound to give a carrier gas stream saturated with the vapor of the organometal compound having a desired temperature and the carrier gas is guided to a chamber for growing crystals in which a crystalline thin film grows on a substrate.

FIG. 10 shows a conventionally known apparatus for vaporizing and supplying an organometal compound. In FIG. 10, the numerical order 1 represents a container for a carrier gas such as $H_2$ gas, 2 represents a valve for reducing pressure, 3 represents a massflow controller (MFC) for controlling the massflow of the carrier gas, 4 represents a liquid organometal compound as a starting material for epitaxial growth and 5 represents a cylinder cabinet which is filled with such a liquid organometal compound 4. The numerical order 6 represents a constant temperature oven, 7 represents an inlet valve and 8 represents a tube for introduction (a dipping tube) which serves to introduce the carrier gas into the lower portion of the cylinder cabinet 5 through an inlet thereof. The numerical order 9 represents an outlet valve and 10 represents a needle valve. The numerical order 11 represents a crystal growth chamber for growing crystals, 12 represents a heater and 13 represents a substrate.

Employing this apparatus for manufacturing a thin film of a semiconductor, first the temperature of the constant temperature oven 6 is correctly controlled to thus determine the vapor pressure of the organometal compound 4. Then the carrier gas of which massflow has been precisely controlled by the massflow controller 3 is introduced into the cylinder cabinet 5 by opening the valve 7 and thereafter the valve 9 is opened to guide the carrier gas containing the vaporized organometal compound in a desired concentration towards the crystal growth chamber 11. Thus, an epitaxial thin film of a semiconductor resulting from the organometal compound grows on the surface of the substrate 13.

However, the epitaxial film thus prepared sometimes has a composition which deviates from a desired composition and non-uniform electrical properties. It is assumed that such phenomena occur because the starting gas for the epitaxial film is not supplied to the crystal-growth chamber 11 in a constant feed rate or flow rate.

It is assumed that the cause of such unstable supply of the starting gas can be attributed to unstable flow rate of the starting gas per unit time, in the foregoing conventional apparatus. It is likewise considered that the supply of the starting gas cannot precisely be controlled since in the conventional apparatus, quick switching between the supply of the starting gas and the interruption thereof cannot be attained.

The optimum supply of the starting gas varies depending on the thickness of the intended epitaxial film and, therefore, it is preferable that the flow rate thereof be simply changed. However, in the aforementioned apparatus, it takes a long time period till a stable flow rate is attained after changing the flow rate of the starting gas. This leads to a low workability.

Moreover, when an epitaxial film comprising mixed crystals of a plurality of elements such as those comprising three or four elements is formed in the foregoing apparatus, the use of constant temperature ovens corresponding to the number of the elements is required in the system for supplying starting gas. As a result, the size of the whole system is enlarged substantially.

SUMMARY OF THE INVENTION

Accordingly, a first object of the present invention is to provide an apparatus for vaporizing and supplying an organometal compound in which a constant supply of the starting gas for an epitaxial film can be ensured.

A second object of the present invention is to provide an apparatus for vaporizing and supplying an organometal compound which makes it possible to perform rapid switching between the supply of the starting gas and the interruption thereof as well as rapid switching of the flow rate thereof.

A third object of the present invention is to provide an apparatus for vaporizing and supplying an organometal compound which is equipped with a supply system for starting gas capable of forming an epitaxial film comprising a mixed crystal consisting of a plurality of elements.

According to an aspect of the present invention, there is provided an apparatus for vaporizing and supplying an organometal compound which makes it possible to achieve the first object of the present invention. The apparatus for vaporizing and supplying an organometal compound comprising a gas flow path for starting gas of an organometal compound which connects a container filled with the organometal compound to a crystal growth chamber heated under reduced pressure through a main valve, a massflow controller for the starting gas and a valve for supplying the starting gas; and a flow path for a carrier gas which connects a carrier gas source to the discharge outlet of the valve for supplying the starting gas through a massflow controller for carrier gas and a heat exchanger; the container, the flow path for the starting gas and the flow path for the carrier gas are arranged in a constant temperature oven.

According to another aspect of the present invention, there is provided an apparatus for vaporizing and supplying an organometal compound which makes it possible to achieve the second object of the present invention. The apparatus for vaporizing and supplying an organometal compound comprising a plurality of flow paths for starting gas of an organometal compound which are branched from a container filled with the organometal compound through a main valve, each of which connects the container to a crystal growth chamber heated under reduced pressure through a massflow controller for the starting gas and a valve for supplying the starting gas; and a plurality flow paths for a carrier gas each of which connects a carrier gas source to the discharge outlet of the valve for supplying the starting gas through a massflow controller for carrier gas, a heat exchanger and a valve for carrier gas; the container, the flow paths for the starting gas and the flow paths for the carrier gas are arranged in a constant temperature oven.

According to a further aspect of the present invention, there is provided an apparatus for vaporizing and supplying an organometal compound which makes it possible to achieve the third object of the present invention. The apparatus for vaporizing and supplying an organometal compound comprising a plurality of flow paths for starting gas of an organometal compound each of which connects one of a plurality of containers filled with the organometal compound to a crystal growth chamber heated under reduced pressure through a main valve, a massflow controller for the starting gas and a valve for supplying the starting gas; and a plurality flow paths for a carrier g as each of which connects a carrier gas source to the discharge outlet of the valve for supplying the starting gas through a massflow controller for carrier gas, a heat exchanger and a valve for carrier gas; each of the plurality of the containers is filled with a different organometal compound, and the whole of the containers, the flow paths for the starting gas and the flow paths for the carrier gas are arranged in a constant temperature oven.

In the apparatus for vaporizing and supplying an organometal compound according to the present invention, the flow path for the organometal compound inclusive of the massflow controller and the flow path for the carrier gas are contained in one constant temperature oven and thus, the apparatus can be substantially miniaturized.

Since the space occupied by the piping is minimized and only a small amount of the gaseous organometal compound or the carrier gas containing the same remains in the pipings, the rapid switching between the supply of the starting gas and the interruption thereof can be expected and the sharpness of the growing boundary of the resulting crystal becomes high. In addition, the control of the gas temperature is easy and the condensation of the starting material in the piping is hardly caused. For this reason, a constant flow rate of the organometal compound can be attained irrespective of the amount thereof supplied to the crystal growth chamber and thus there can be obtained not only a thick film but also a very thin film of a semiconductor crystal having very low scatter in the composition thereof.

According to the apparatus of the present invention, the starting gas discharged from a single container for starting gas can be supplied to the crystal growth chamber in portions through a plurality of flow paths. Moreover, a plurality of starting gases can be supplied from a single supply apparatus. Therefore, when compared with the conventional apparatuses having identical functions, the apparatus per se is small-sized and the number of parts required is also small.

The flow rate of the starting material can precisely and rapidly be controlled and not only a thick film but also a very thin film of a semiconductor crystal can be prepared by a single apparatus. It is also possible to arbitrarily or freely change the composition of a heterocrystal and, therefore, the sharpness of the crystal growing boundary is excellent. Further, the amount of the starting material to be supplied to the crystal growth chamber is controlled by always monitoring the supply (flow rate) thereof and thus the scatter of the composition of the resulting crystal is very low.

DETAILED EXPLANATION OF THE INVENTION

The embodiments of the present invention will hereunder be explained in more detail with reference to the attached figures.

Figure 1:
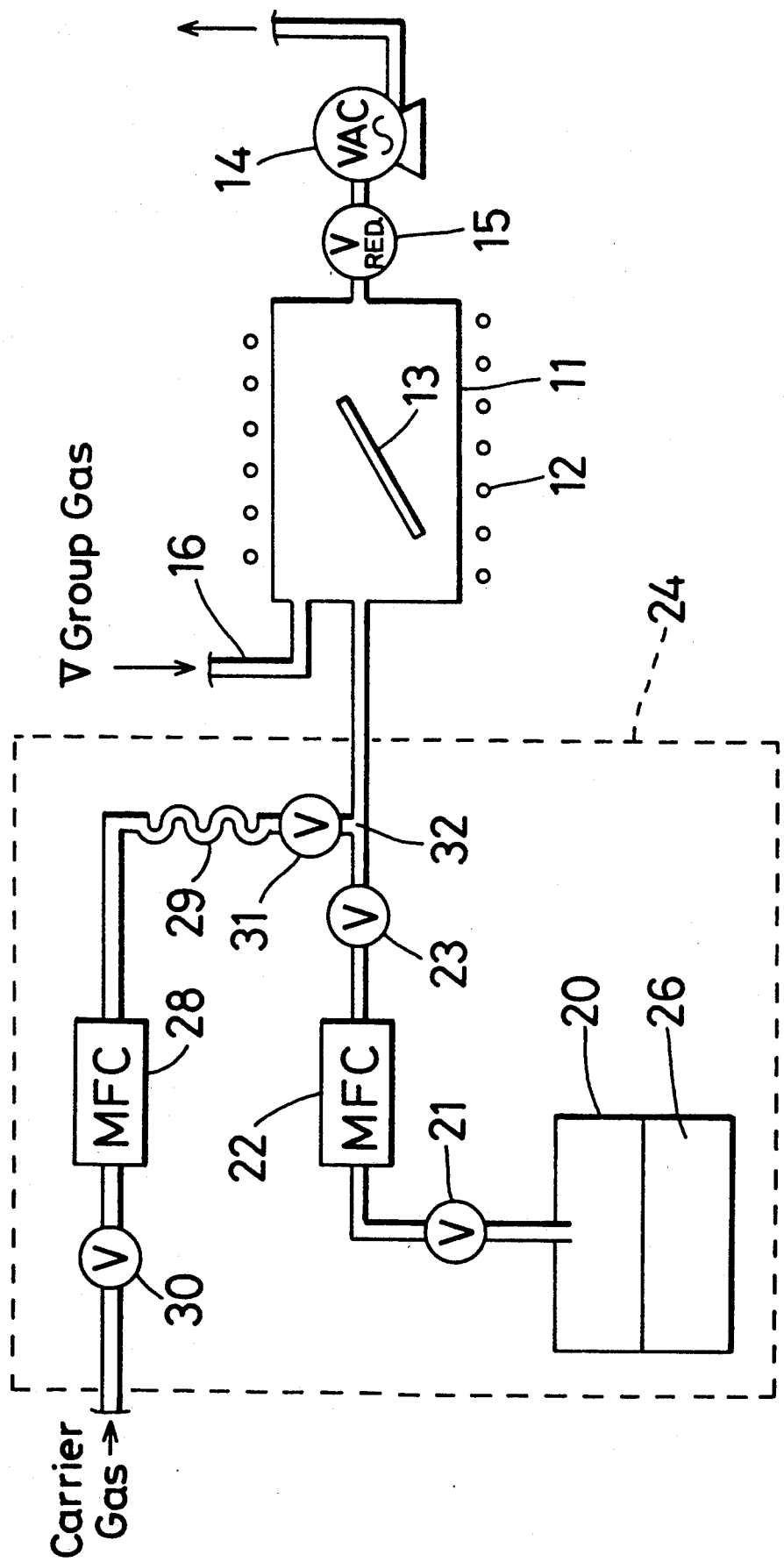
FIG. 1 is a block schematic diagram for illustrating an embodiment of the apparatus for vaporizing and supplying an organometal compound according to the present invention.

FIG. 1 is a block schematic diagram for illustrating an embodiment of the apparatus for vaporizing and supplying an organometal compound according to the present invention. As seen from FIG. 1, a cylindrical container 20 in which an organometal compound 26 is introduced is connected to a massflow controller 22 through a pneumatic valve 21. The massflow controller 22 is connected to a crystal growth chamber 11 through a pneumatic gas supply valve 23 for starting gas. A vacuum pump 14 is communicated to the crystal growth chamber 11 through a valve 15 for controlling the degree of present reduction. The crystal growth chamber 11 is equipped with a heater 12 to raise the temperature thereof and a tube 16 for introducing a gas containing a Group V element.

A source of carrier gas such as hydrogen gas for promoting the heat decomposition of the starting material is connected to a part 32 for connection disposed at the discharge outlet side through a valve 30, a massflow controller 28 for the carrier gas, a heat exchanger 29 and a carrier gas valve 31 in order. Each connection described above can be achieved by a conduit and the foregoing parts constitute a closed system. The cylindrical container 20 as well as the massflow controllers 22 and 28, the heat exchanger 29, valves 21, 23, 30 and 31 and the connecting part 32 are all contained in a constant temperature air oven 24. As the massflow controller 22, preferred is one which can detect very low flow rate, is provided with a flow rate controlling valve having a short response time and can operate at a pressure as low as possible.

This apparatus will be operated as follows:

First, a substrate 13 is fitted to the crystal growth chamber 11 and heated to a desired temperature with the heater 12 while the pressure of the chamber is reduced by a vacuum pump 14. A desired amount of the carrier gas is supplied to the crystal growth chamber by opening the valves 30 and 31 and the valve 15 for controlling the degree of pressure reduction is adjusted to maintain a constant degree of pressure reduction in the crystal growth chamber 11. The flow rate of the carrier gas should be adjusted to a level as high as possible for minimizing the retention time of the gaseous organometal compound within the piping, but in general it ranges from about 10 to 300 ml/min.

As the temperature of the constant temperature air oven 24 reaches a desired level, the vapor pressure of the organometal compound 26 in the cylindrical container 20 is elevated and the compound starts vaporization. The temperature of the constant temperature oven 24 varies depending on various factors such as the heat resistance of the massflow controllers 22 and 28 and the valves as well as physical properties of the organometal compound 26 such as vapor pressure and heat decomposition temperature and, therefore, cannot be controlled to a unique value, but it is in general adjusted to the range of from 50° to 80° C. at which a sufficiently high vapor pressure thereof can be obtained and which makes it possible to always supply sufficient heat to the organometal compound for compensating the heat of vaporization of the compound.

At this stage, air is sent to the pneumatic main valve 21 and the starting material-supply valve 23 through a power source (not shown) to open the valves. Thus, the vaporized organometal compound 26 is introduced into the massflow controller 22 through the valve 21, in which the mass flow rate is directly determined and controlled to a constant value. Thus, the vaporized organometal compound is supplied to the crystal growth chamber 11 through the valve 23. On the other hand, the carrier gas is continuously supplied through the carrier gas valve 31 after the flow rate thereof is determined and controlled by the massflow controller 28 for carrier gas and is sufficiently heated by the heat exchanger 29. At this stage, the amount of the carrier gas is adjusted to several hundred times that of the organometal compound 26. Therefore, no organometal compound remains in the gas supply system and thus the compound is supplied to the crystal growth chamber 11 at a constant concentration. The carrier gas is heated at a high efficiency since the gas flow path including the massflow controller 28 for carrier gas is contained in the constant temperature air oven 24.

In such way, an epitaxial thin film of a semiconductor grows on the substrate 13 positioned within the crystal growth chamber 11. When the thickness of the epitaxial film reaches a desired level, air is supplied to the pneumatic valve 23 to close the same to thus interrupt the supply of the gaseous organometal compound.

Figure 2:
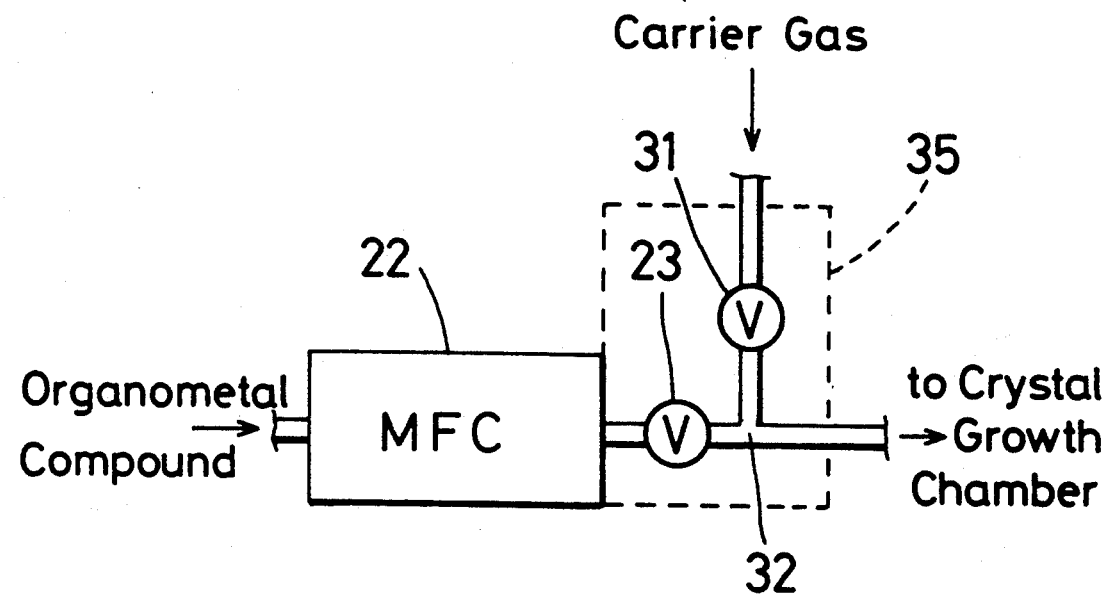
FIGS. 2 and 3 are block schematic diagrams for illustrating main parts of the embodiments of the apparatus for vaporizing and supplying an organometal compound according to the present invention.

When the flow rate of the organometal compound 26 is very low, the volume of the organometal compound is small compared with the volume of the piping from the massflow controller 22 till the connection part 32 through the valve 23 and thus the gas non-uniformly diffuses within piping. This often results in the variation in the amount of the organometal compound supplied to the crystal growth chamber 11. In such a case, it is sufficient to use a block valve 35 realized by integrating the valves 23 and 31 and to directly connect the same to the outlet of the massflow controller 22 as shown in FIG. 2. Thus, the volume within the piping is reduced and the time required for the compound to pass through the piping is shortened, whereby the flow rate is stabilized.

Figure 3:
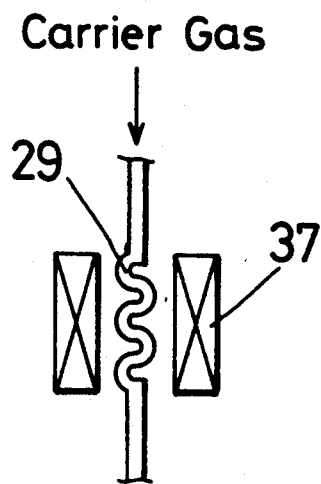

The heat exchanger 29 whose heat source is the air in the constant temperature oven 24 makes it possible to sufficiently supply heat to the carrier gas. However, if the carrier gas must be heated to an elevated temperature, an electric heater 37 may be fitted to the heat exchanger to thus separately heat the carrier gas as shown in FIG. 3.

Figure 4:
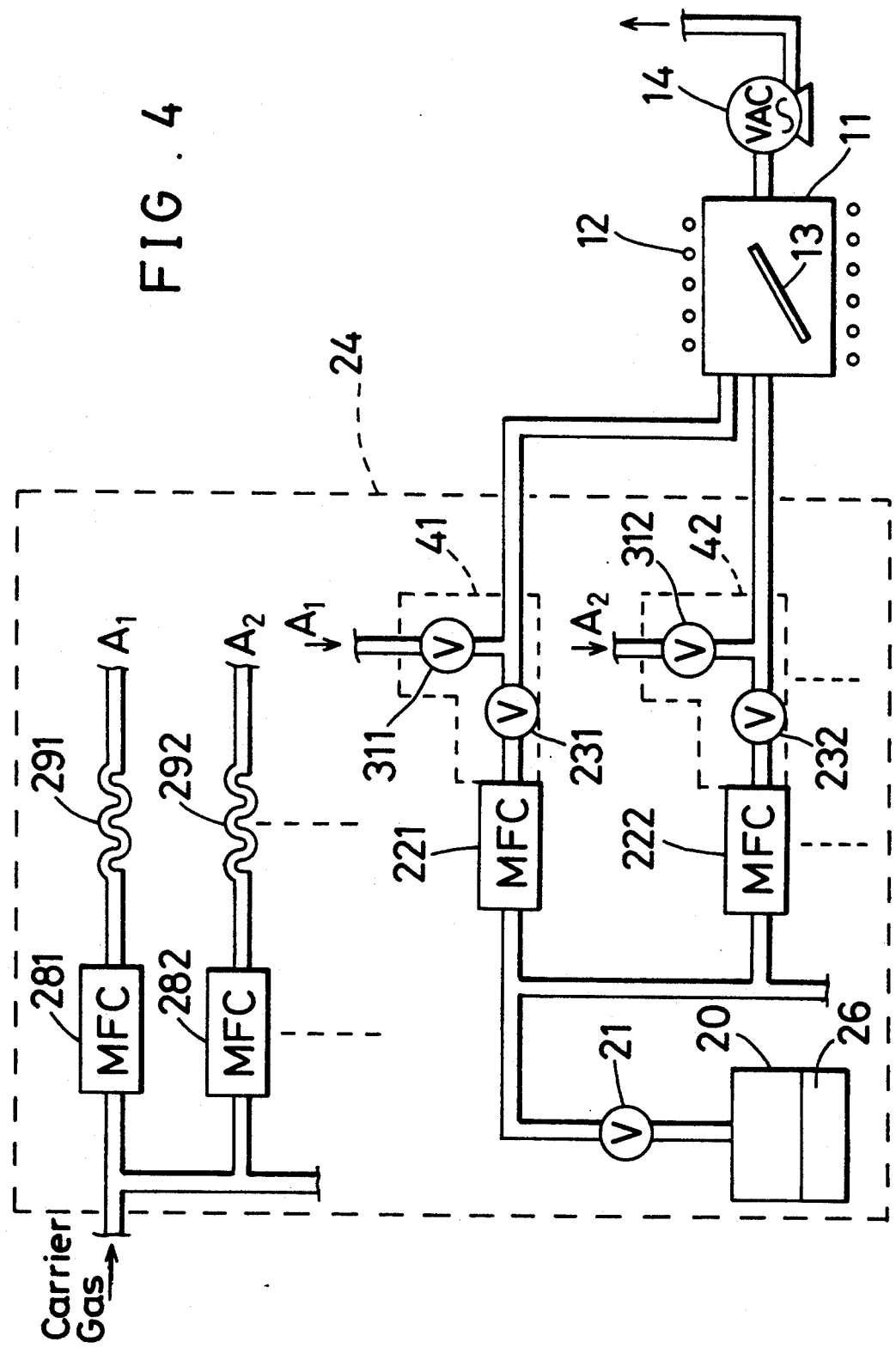
FIG. 4 is a block schematic diagram for illustrating another embodiment of the apparatus for vaporizing and supplying an organometal compound according to the present invention.

FIG. 4 is a block schematic diagram for illustrating another embodiment of the apparatus for vaporizing and supplying an organometal compound according to the present invention. As is shown in this figure, a cylinder container 20 filled with an organometal compound 26 is branched into a plurality of flow paths through a valve 21. Each of the branched flow path is connected to the corresponding massflow controller 221, 222, etc. Each massflow controller 221,222, etc. is communicated to the crystal growth chamber 11 through each corresponding starting gas-supply valve 231, 232, etc. at its discharge outlet, respectively. The crystal growth chamber 11 is designed to be heated by a heater 12 and connected to a vacuum pump 14.

Each flow path for carrier gas is connected to a carrier gas valve 311, 312, etc. through a massflow controller 281, 282, etc., a heat exchanger 291, 292, etc. and a connecting path $A_1$, $A_2$, etc. Moreover, the outlet of each carrier gas valve 311, 312, etc. is connected to the outlet of each corresponding starting gas supply valve 231, 232, etc.

These starting gas supply valve 231, 232, etc. and carrier gas valve 311, 312, etc. are pneumatic valves having a very short response time. In addition, the starting gas supply valve 231 and the carrier valve 311 are integrated into a three-way block valve 41 and likewise the starting gas supply valve 232 and the carrier valve 312 are integrated into a three-way block valve 42. These block valves are directly connected to the discharge outlet of the massflow controllers 221, 222, etc., respectively. In such a way, the dead space formed within the block valves 41, 42, etc. and before and behind the same can be minimized.

All of these cylindrical container 26, main valve 21, massflow controllers 221, 222 etc., massflow controllers 281, 282, etc., heat exchangers 291, 292, etc. and block valves 41, 42, etc. are contained in the constant temperature oven 24.

The apparatus will be operated as follows:

First, the substrate 13 is fitted to the crystal growth chamber 11, heated to a predetermined temperature by the heater 12 while the vacuum pump 14 is operated to reduce the pressure within the chamber. The carrier gas valves 311, 312, etc. are opened so that a predetermined amount of the carrier gas is introduced into the chamber previously while determining the amount (flow rate) thereof with the massflow controllers 281, 282, etc. The amount of the carrier gas to be introduced therein should be 2 or 3 or more times the total volume of the piping for supplying the organometal compound, i.e., in the order of 100 to 500 ml/min.

As the temperature of the constant temperature oven 24 is elevated to a predetermined level, the organometal compound 26 contained in the cylinder container 20 is heated and vaporized. On the other hand, the measured carrier gas is heated by the heat exchangers 291, 292, etc. At this stage, the main valve 21 and the starting gas supply valve 231, 232, etc. are opened. Thus, the gaseous organometal compound 26 generated is introduced into the massflow controller 221, 222, etc. through the main valve 21 and the mass flow rate thereof is directly determined in the massflow controller. Thus the flow rate of the gaseous organometal compound 26 is adjusted to a constant value, then the organometal compound is mixed with the carrier gas within the block valve 41, 42, etc. and supplied to the crystal growth chamber 11. Since the inner dead space of the block valve 41, 42, etc. is small and the valve is directly connected to the discharge outlet of the massflow controller 221, 222, etc., the starting gas is rapidly supplied to the crystal growth chamber 11 while a uniform concentration of the compound is maintained.

Thus, an epitaxial film of a semiconductor grows on the surface of the substrate 13 placed within the crystal growth chamber 11. When the epitaxial film grows to a desired thickness, the valve 231, 232, etc. for supplying the starting gas is closed to thus interrupt the supply of the gaseous organometal compound. In order to change the amount of the gaseous organometal compound, the set value of the massflow controller 221, 222, etc. should be changed. Alternatively, the flow rate of each massflow controller 221, 222, etc. may be previously set up at a value different from one another and the flow path may be switched by opening or closing the starting gas supply valve 231, 232, etc. Thus, the flow rate can be changed instantaneously.

Each massflow controller 221, 222, etc. may have the same control area, but if it is necessary to precisely control the flow rate within a wide control area, the massflow controllers 221, 222, etc. having different control area respectively are employed.

Figure 5:
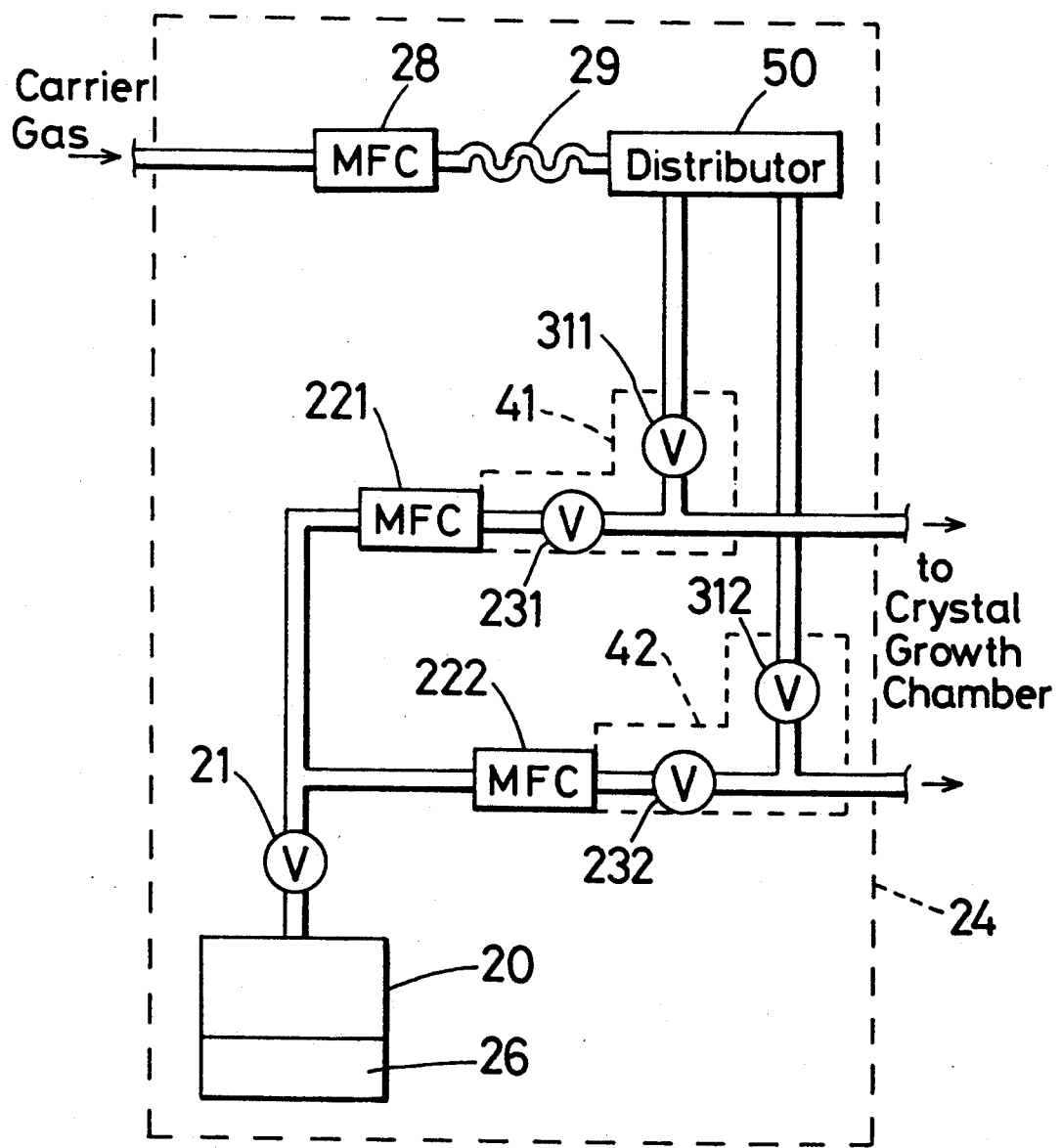
FIGS. 5, 6 and 7 are block schematic diagrams for illustrating main parts of other embodiments of the apparatus for vaporizing and supplying an organometal compound according to the present invention.

FIG. 5 shows another embodiment of the apparatus for supplying an organometal compound according to the present invention. In the apparatus, the carrier gas is introduced into the crystal growth chamber through a single flow path. More specifically, the carrier gas passes through a massflow controller 28 and a heat exchanger 29, is distributed by a distributor 50 and then supplied to the block valves 41 and 42. The apparatus is effective for reducing the size of the apparatus and for saving cost when the use of many flow paths for supplying the organometal compound are required.

Figure 6:
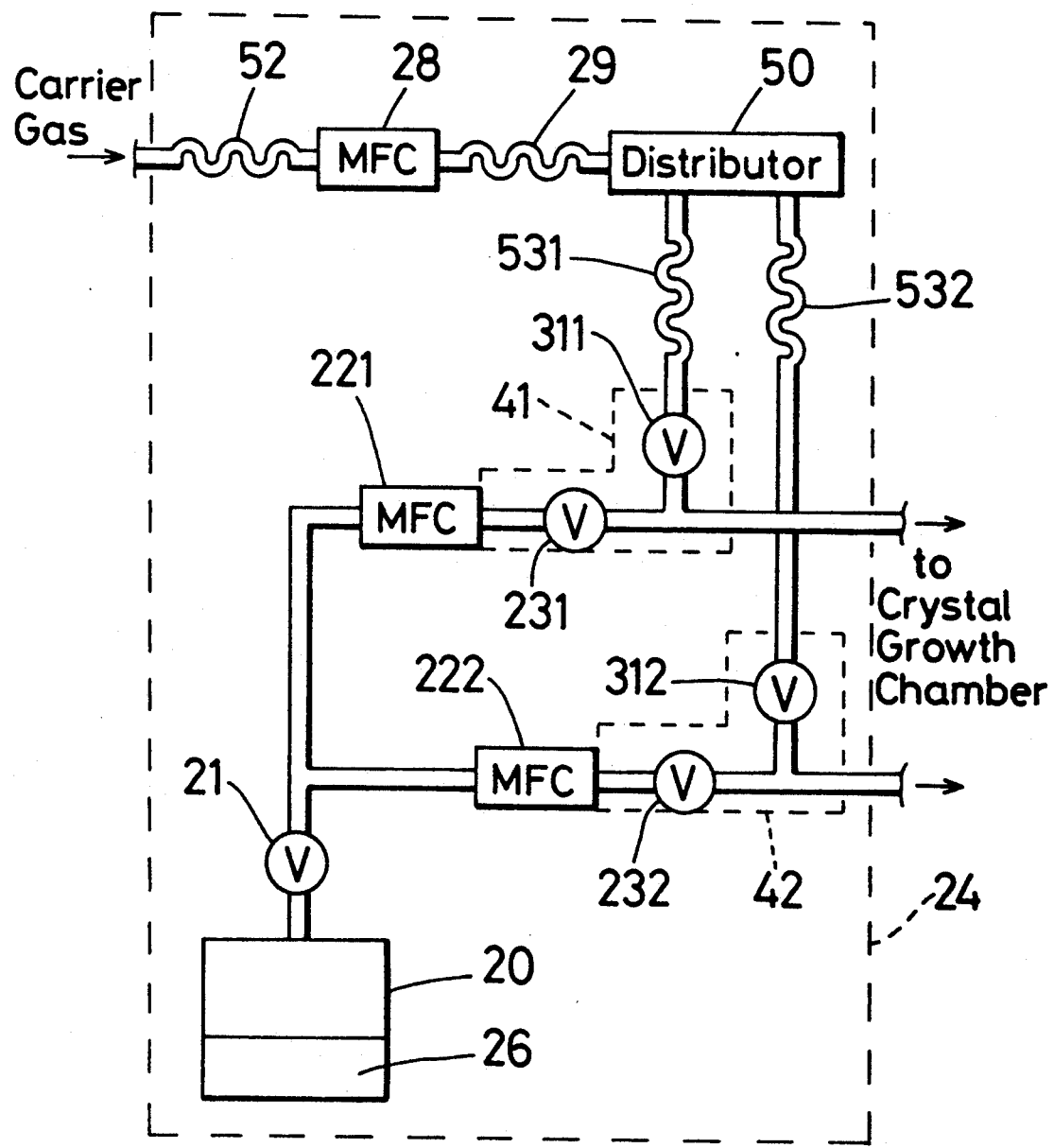

When the use of many flow paths for supplying the organometal compound are required, the amount of the carrier gas to be supplied is correspondingly increased and hence it is sometimes observed that the temperature of the carrier gas cannot be elevated simply by the heat exchanger 29. In such case, a heat exchanger 52 is disposed at the inlet side of the massflow controller 28 and heat exchangers 531 and 532 are disposed at the outlet side of the distributor 50 in addition to the heat exchanger 29 as shown in FIG. 6. These heat exchanger 29, 52, 531, and 532 per se may be directly heated by a heating means such as an electric heater or a resistance heating element.

Figure 7:
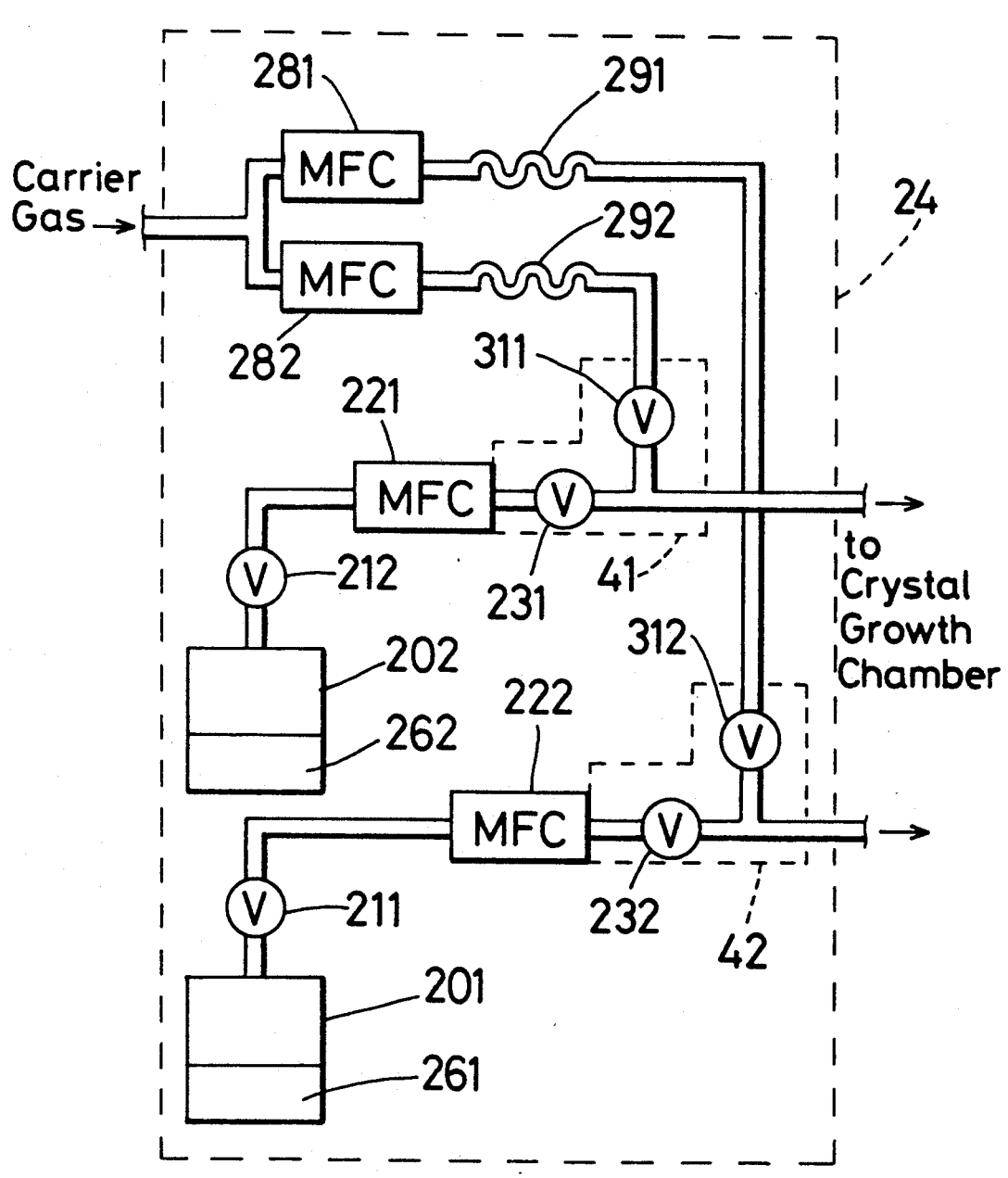

Upon growing a multicomponent mixed crystal, containers 201 and 202 which are filled with different kinds of organometal compounds 261 and 262 respectively are contained in the same constant temperature oven 24 as shown in FIG. 7. If these containers 201 and 202 are heated to the same temperature, several kinds of organometal compounds can be supplied to the crystal growth chamber by a single apparatus.

Figure 8:
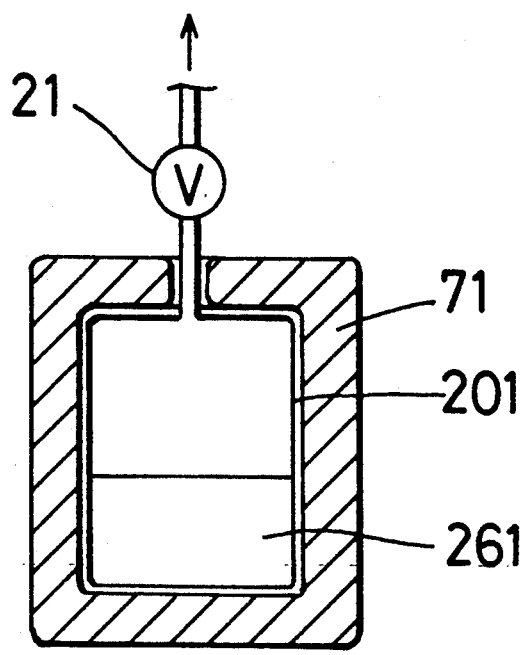
FIGS. 8 and 9 show enlarged sectional views of main parts of the embodiments of the apparatus for vaporizing and supplying an organometal compound according to the present invention.
Figure 9:
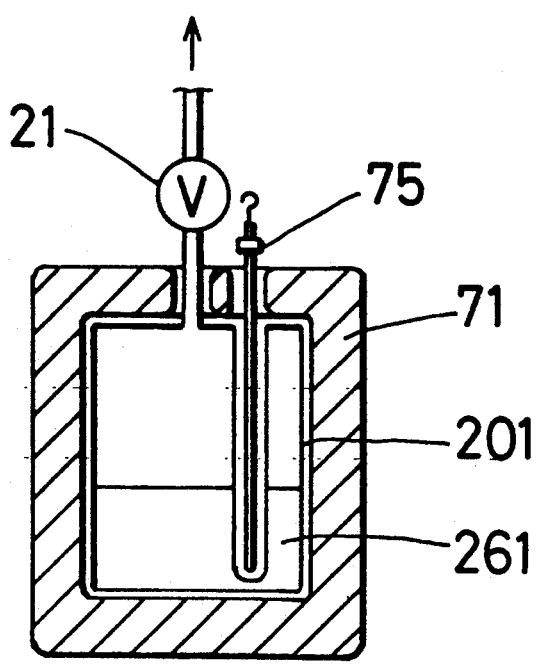
Figure 10:
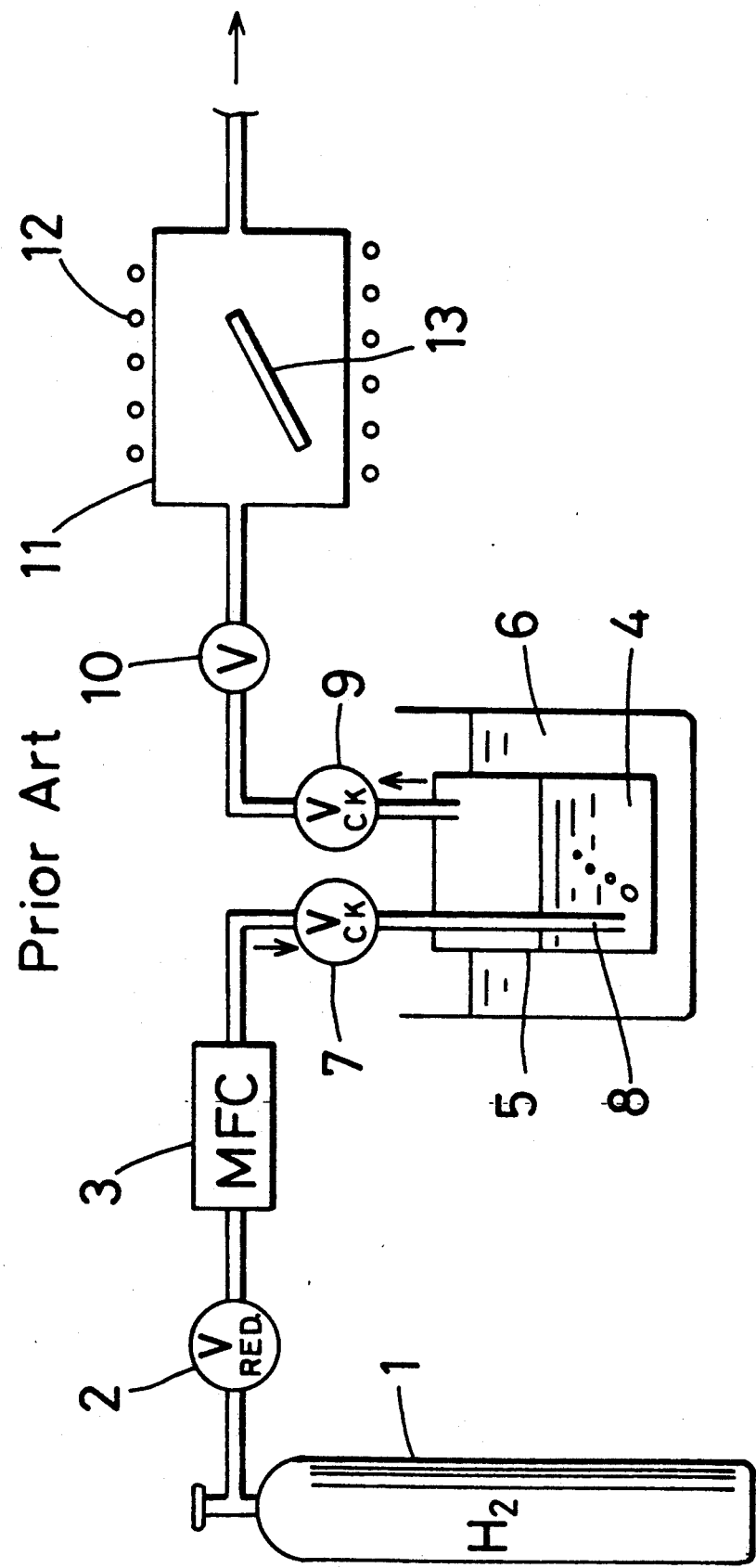
FIG. 10 is a block schematic diagram for illustrating a conventional apparatus for vaporizing and supplying an organometal compound.

In this apparatus, the organometal compounds 261 and 262 are heated by the air in the constant temperature oven 24. However, the supply of heat to the organometal compounds 261 and 262 often becomes insufficient as the amount of the gaseous organometal compounds supplied to the crystal growth chamber increases. In such case, it is desirable that the container 201 per se is directly heated utilizing a heating means 71 such, as an electric heater or a resistance heating element (for instance, a block heater) as shown in FIG. 8. Moreover, if the internal temperature of the container 201 is determined using a temperature sensor 75 as shown in FIG. 9, more proper temperature control can be achieved.

In the present invention there are employed valves or the like which are pneumatically or manually operated and have high heat resistance and good resistance to high vacuum. The cylindrical container 20 and pipings are those made from stainless steel from the viewpoint of safely storing and/or transferring the organometal compounds. The walls thereof which come in contact with the gases are desirably subjected to electrolytic graining treatment.

What is claimed is:

1. An apparatus for vaporizing and supplying an organometal compound comprising:

a main gas flow path for passing vaporized organometallic compound from a container to a crystal growth chamber having heating means and means for reducing the pressure therein through a first main valve, a main massflow controller having a discharge outlet, and a second main valve having a discharge outlet;

a carrier gas flow path for passing a carrier gas from a carrier gas source to the discharge outlet of the second main valve through a first carrier gas valve, a carrier gas massflow controller, a heat exchanger and a second carrier gas valve; and a constant temperature oven for holding the main gas flow path including the first main valve, the main massflow controller and the second main valve, the container, and the carrier gas flow path including the first carrier gas valve, the carrier gas massflow controller, the heat exchanger and the second carrier gas valve, wherein the second main valve and the second carrier gas valve are integrated into a block valve, which is directly connected to the discharge outlet of the main massflow controller.

2. The apparatus for vaporizing and supplying the organometal compound as set forth in claim 1, wherein the heat exchanger is provided with a heating means.

3. The apparatus for vaporizing and supplying an organometal compound as set forth in claim 1 wherein the heat exchanger is provided with a heating means.

4. The apparatus for vaporizing and supplying an organometal compound as set forth in claim 2 wherein each container is provided with a heating means.

5. An apparatus for vaporizing and supplying an organometal compound comprising:

multiple branched main gas flow paths for passing vaporized organometallic compound from a container to a crystal growth chamber having heating means and means for reducing the pressure therein through a first main valve, main massflow controllers having discharge outlets, and second main valves having discharge outlets;

multiple branched carrier gas flow paths for passing carrier gas from a carrier gas source to the discharge outlets of the second main valves through carrier gas massflow controllers, heat exchangers and carrier gas valves; and a constant temperature oven for holding the multiple branched main gas flow paths including the first main valve, the main massflow controllers and the second main valves; the container; and the multiple branched carrier gas flow paths including the carrier gas massflow controllers, the heat exchangers and the carrier gas valves, each of the second main valves and each of the second carrier gas valves being integrated into a block valve, which is directly connected to a discharge outlet of each of the main massflow controllers.

6. The apparatus for vaporizing and supplying the organometal compound as set forth in claim 5, which further comprises a distributor for distributing the carrier gas to the block valves, and wherein the multiple branched carrier gas flow paths have at least one heat exchanger placed between the carrier gas source and the massflow controller, between the massflow controller and the distributor, or between the distributor and the carrier gas valves.

7. The apparatus for vaporizing and supplying the organometal compound as set forth in claim 5, wherein the multiple branched main gas flow paths are connected to a plurality of containers and all of the containers are held in the constant temperature oven.

8. The apparatus for vaporizing and supplying the organometal compound as set forth in claim 5, wherein each of the containers is provided with a heating means.

9. The apparatus for vaporizing and supplying the organometal compound as set forth in claim 5, wherein each of the containers is provided with a temperature sensor for detecting the internal temperature thereof.

* * * * *